(12) United States Patent
Renfrow (10) Patent No.: US 7,362,111 B2
(45) Date of Patent: *Apr. 22, 2008

(54) DEVICE FOR EVALUATING AT LEAST ONE ELECTRICAL CONDUCTING STRUCTURE OF AN ELECTRONIC COMPONENT

(75) Inventor: Alan A. Renfrow, Wilder, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/922,204

(22) Filed: Aug. 18, 2004

(65) Prior Publication Data

US 2005/0017744 A1    Jan. 27, 2005

Related U.S. Application Data

(60) Continuation of application No. 10/299,630, filed on Nov. 18, 2002, now Pat. No. 6,853,207, which is a division of application No. 09/448,882, filed on Nov. 24, 1999, now Pat. No. 6,504,378.

(51) Int. Cl.
*G01R 31/02* (2006.01)

(52) U.S. Cl. .......................... 324/754; 324/758

(58) Field of Classification Search ................ 324/538, 324/754–765, 158.1; 439/912
See application file for complete search history.

(56) References Cited

U.S. PATENT DOCUMENTS

| 3,441,853 | A |   | 4/1969  | Bodine |  |
|---|---|---|---|---|---|
| 3,573,617 | A |   | 4/1971  | Randolph et al. |  |
| 3,701,077 | A |   | 10/1972 | Kelly, Jr. |  |
| 3,870,953 | A | * | 3/1975  | Boatman et al. | 324/72.5 |
| 3,917,376 | A | * | 11/1975 | Lane, III | 439/41 |
| 3,970,934 | A |   | 7/1976  | Aksu |  |
| 4,056,773 | A |   | 11/1977 | Sullivan |  |
| 4,068,170 | A | * | 1/1978  | Chayka et al. | 324/72.5 |
| 4,161,346 | A | * | 7/1979  | Cherian et al. | 439/66 |
| 4,218,653 | A |   | 8/1980  | Emo |  |
| 4,348,276 | A | * | 9/1982  | Tateishi et al. | 209/573 |
| 4,357,062 | A |   | 11/1982 | Everett |  |
| 4,410,227 | A | * | 10/1983 | Prunella et al. | 439/296 |

(Continued)

FOREIGN PATENT DOCUMENTS

JP        08292230      5/1996

(Continued)

*Primary Examiner*—Paresh Patel
(74) *Attorney, Agent, or Firm*—TraskBritt (57) ABSTRACT

An apparatus and method for evaluating the integrity of each contact pin of an electronic component having multiple contact pins. In one embodiment, the apparatus includes a test device and a measuring instrument. The test device comprises a component fixture configured to hold an electronic component under test and opposing contact plates for establishing electrical communication between the contact pins of the electronic component and the measuring instrument. The test device may include separate linear positioners associated with each opposing contact plate configured to move the contact plates relative to the component fixture and electronic component under test. The measuring instrument measures at least one electrical characteristic of a pin contact. In another embodiment, the apparatus further includes a system controller in communication with the measuring instrument and configured to control functioning of the measuring instrument.

18 Claims, 7 Drawing Sheets

U.S. PATENT DOCUMENTS

| | | | |
|---|---|---|---|
| 4,419,626 A * | 12/1983 | Cedrone et al. | 324/761 |
| 4,460,236 A | 7/1984 | Strautz | |
| 4,461,525 A * | 7/1984 | Griffin | 439/368 |
| 4,505,529 A * | 3/1985 | Barkus | 439/82 |
| 4,548,451 A * | 10/1985 | Benarr et al. | 439/85 |
| 4,675,600 A * | 6/1987 | Gergin | 324/754 |
| 4,678,250 A | 7/1987 | Romine et al. | |
| 4,829,235 A | 5/1989 | Robinson et al. | |
| 4,835,465 A * | 5/1989 | Gergin | 324/754 |
| 4,841,231 A | 6/1989 | Angelucci | |
| 4,952,871 A | 8/1990 | Driller et al. | |
| 4,961,709 A * | 10/1990 | Noschese | 439/66 |
| 4,978,912 A | 12/1990 | Vonder et al. | |
| 5,088,930 A | 2/1992 | Murphy | |
| 5,093,982 A | 3/1992 | Gussman | |
| 5,097,213 A | 3/1992 | Hunting et al. | |
| 5,137,456 A * | 8/1992 | Desai et al. | 439/66 |
| 5,163,312 A * | 11/1992 | Ayers | 73/37.5 |
| 5,177,528 A * | 1/1993 | Koromegawa et al. | 355/53 |
| 5,180,976 A | 1/1993 | Van Loan et al. | |
| 5,241,277 A | 8/1993 | Kefalas | |
| 5,463,325 A | 10/1995 | Fujii | |
| 5,469,064 A | 11/1995 | Kerschner et al. | |
| 5,489,851 A | 2/1996 | Heumann et al. | |
| 5,508,629 A | 4/1996 | Stewart et al. | |
| 5,557,209 A | 9/1996 | Crook et al. | |
| 5,574,383 A | 11/1996 | Saito et al. | |
| 5,640,102 A | 6/1997 | Sato | |
| 5,742,169 A | 4/1998 | Akram et al. | |
| 5,757,201 A | 5/1998 | Partridge et al. | |
| 5,795,172 A * | 8/1998 | Shahriari et al. | 439/260 |
| 5,800,184 A * | 9/1998 | Lopergolo et al. | 439/66 |
| 5,844,421 A | 12/1998 | Lee et al. | |
| 5,909,124 A | 6/1999 | Madine et al. | |
| 5,977,776 A * | 11/1999 | Huth et al. | 324/537 |
| 6,005,401 A | 12/1999 | Nakata et al. | |
| 6,008,664 A | 12/1999 | Jett et al. | |
| 6,043,442 A | 3/2000 | Park et al. | |
| 6,133,745 A | 10/2000 | Yoon et al. | |
| 6,208,156 B1 | 3/2001 | Hembree | |
| 6,211,687 B1 * | 4/2001 | Leong | 324/754 |
| 6,262,580 B1 | 7/2001 | Wu | |
| 6,281,694 B1 | 8/2001 | Tsai | |
| 6,297,652 B1 * | 10/2001 | Shimoda et al. | 324/754 |
| 6,353,327 B2 * | 3/2002 | Nishikawa | 324/758 |
| 6,356,093 B2 * | 3/2002 | Nishikawa et al. | 324/758 |
| 6,486,691 B2 | 11/2002 | Tsujii | |
| 6,504,378 B1 * | 1/2003 | Renfrow | 324/538 |

FOREIGN PATENT DOCUMENTS

JP     08304503 A  *  11/1996

* cited by examiner

DEVICE FOR EVALUATING AT LEAST ONE ELECTRICAL CONDUCTING STRUCTURE OF AN ELECTRONIC COMPONENT

CROSS-REFERENCE TO RELATED APPLICATIONS

This application is a continuation of application Ser. No. 10/299,630, filed Nov. 18, 2002, now U.S. Pat. No. 6,853,207, issued Feb. 8, 2005, which is a divisional of application Ser. No. 09/448,882, filed Nov. 24, 1999, now U.S. Pat. No. 6,504,378, issued Jan. 7, 2003.

BACKGROUND OF THE INVENTION

1. Field of the Invention

The present invention relates generally to the manufacturing and testing of electronic components. Specifically, the present invention relates to a method and apparatus for evaluating the electrical characteristics of each contact pin of an electronic component having multiple contact pins used in the testing of electronic devices, such as integrated circuit devices.

2. State of the Art

Generally, electronic components can be thought of as comprising a case for housing internal circuitry and a connecting structure for establishing electrical communication with the outside world—external devices such as power sources, test instruments, a second electronic component, or any other electronic device. A common connecting structure used to achieve electrical communication between an electronic component and external devices is a contact pin. A contact pin is a metal, rod-shaped body having an external portion extending from a surface of the component case and an internal portion within the component case. Electrical connecting structures comprising contact pins are well known in the art.

The external portion of the contact pin body provides a connecting point for establishing electrical contact between the contact pin and an external device. Connection to the contact pin may be temporary—for example, by using a male-female socket connector—or connection to the contact pin may be permanent—such as may be achieved using solder. The internal portion of the contact pin body may establish electrical communication with internal circuitry of the electronic component. Alternatively, the internal portion may extend through the component case and project from another surface of the electronic component, thereby establishing a second connecting point on the contact pin. The second connecting point allows an external device electrically connected to the first connecting point of the contact pin to electrically communicate with another external device connected to the second connecting point. One type of electronic component that may have such a structure is what will be referred to herein as a testsite module. A testsite module is essentially a test bed for a second electronic component. The testsite module serves as a conduit between the second component and other external devices, such as a test instrument. Also, a contact pin may provide both a connection to internal circuitry and a second connecting point.

Although an electronic component may have only one contact pin, a plurality of contact pins is routinely necessary. For example, an electronic component may be used in an application that requires multi-channel communication capabilities, thus requiring that the electronic component have multiple contact pins. For an electronic component having multiple contact pins, the contact pins are usually arranged in one or more two-dimensional arrays on the surface of the component case, thereby forming a pin-out. The use of hundreds of contact pins on electronic components is known.

During the manufacture of electronic components, the components are routinely subjected to one or more tests to determine their electrical characteristics. Methods and apparatus for performing electrical characterization of electronic components are well known in the art. The type of electrical testing performed on an electronic component varies widely, depending on the type of component being tested and individual needs. During testing of electronic components having multiple contact pins, electrical communication between the electronic component and test instrumentation is generally established via the contact pins. Thus, of critical importance in the design, manufacture, and testing of electronic components having a plurality of contact pins is the electrical integrity of the pin-out itself.

A damaged or defective pin-out on an electronic component may prohibit communication with the electronic component during testing, or may result in the electronic component producing a false reading such as, for example, a false pass or fail condition. Thus, the internal circuitry of the electronic component may be inaccurately characterized. If the electronic component is a testsite module functioning as an electrical interface between a test instrument and a second electronic component, a damaged or defective pin-out may result in inaccurate characterization of the second component. Characteristics that may be indicative of a damaged or defective pin-out include: a shorted condition between an individual contact pin and any other contact pin in the pin-out (pin-to-pin shorting), a shorted condition between an individual contact pin and the component case (pin-to-case shorting), individual contact pin resistance that exceeds a known threshold (pin resistance), and the existence of a high-resistance connection between adjacent contact pins (pin-to-pin leakage).

Evaluation of pin-out integrity on electronic components such as testsite modules is conventionally performed manually by a test operator using a hand-held multi-meter. The conventional process requires the test operator to measure the electrical characteristics of each contact pin, one contact pin at a time. Electronic components in the form of testsite modules commonly have pin-outs comprised of 54 or more contact pins. When measuring pin-to-pin shorting, for example, the contact pin being evaluated will be checked for a shorted condition relative to every other contact pin in the pin-out and, typically, every contact pin in the pin-out will be evaluated for pin-to-pin shorting. Thus, manual testing can be time consuming and susceptible to human-introduced errors such as, for example, inaccurate measurement, non-repeatability from one contact pin evaluation to the next, and non-repeatability from one electronic component evaluation to the next.

Therefore, a need exists for a method and apparatus for testing the electrical integrity of each contact pin on an electronic component having multiple contact pins. Further, a need exists for a method and apparatus for characterizing the electrical properties of a pin-out that are accurate and repeatable. Additionally, a need exists for a method and apparatus for characterizing contact pins that is adaptable to automation and requires minimal intervention by a test operator.

BRIEF SUMMARY OF THE INVENTION

The apparatus of the present invention is generally comprised of a test device, a measuring instrument, and a system controller. The test device is configured to hold an electronic component under test (ECUT) and to establish electrical contact with a pin-out on the component. Simultaneous electrical contact may be established between all contact pins of the pin-out and a contact plate on the test device. If the ECUT has contact pins extending through its case to form a second connecting point on each contact pin, simultaneous electrical contact may be established with both connecting points on each contact pin using a second contact plate on the test device.

The measuring instrument is electrically connected to the contact plates such that electrical communication is established between the measuring instrument and each contact pin on the ECUT. The measuring instrument is also in electrical communication with the system controller, allowing the system controller to direct the function of the measuring instrument. The measuring instrument is configured to measure the electrical characteristics of each contact pin on the ECUT that are indicative of a damaged or defective contact pin. In addition, the measuring instrument may be configured to record and store the measured properties. Electrical characteristics indicative of a damaged or defective contact pin include, but are not limited to, pin-to-pin shorting, pin-to-case shorting, pin resistance, and pin-to-pin leakage.

The system controller is configured to direct the test device and measuring instrument to perform at least a portion of a test sequence on the pin-out of the ECUT. In one embodiment, the contact plates of the test device are each associated with a positioning system adapted for computer control, thereby enabling the system controller to direct the test apparatus to establish electrical communication with the ECUT. The system controller may further be adapted to store and report the results of the test sequence.

The test sequence or method of the present invention may, by way of example only, include the following steps: test operator places an ECUT into the test device; system controller directs the test device to establish electrical contact with the contact pins of the ECUT; system controller directs the measuring instrument to measure at least one electrical characteristic of each contact pin on the ECUT; system controller directs the test device to establish electrical contact with the second connecting point, if any, on each contact pin of the ECUT; system controller directs the measuring instrument to measure another electrical characteristic of each contact pin on the ECUT; system controller directs the test device to terminate electrical contact with the ECUT; system controller directs the measuring instrument to report the test results to the test operator; and test operator removes the ECUT from the test device. This method may then be repeated for another ECUT.

BRIEF DESCRIPTION OF THE SEVERAL VIEWS OF THE DRAWINGS

While the specification concludes with claims particularly pointing out and distinctly claiming that which is regarded as the present invention, the features and advantages of the present invention can be more readily ascertained from the following detailed description of the invention when read in conjunction with the accompanying drawings, in which:

DETAILED DESCRIPTION OF THE INVENTION

As illustrated in drawing FIGS. 1 through 8 contain many identical elements, which retain the same numerical desination in all figures.

Figure 1:
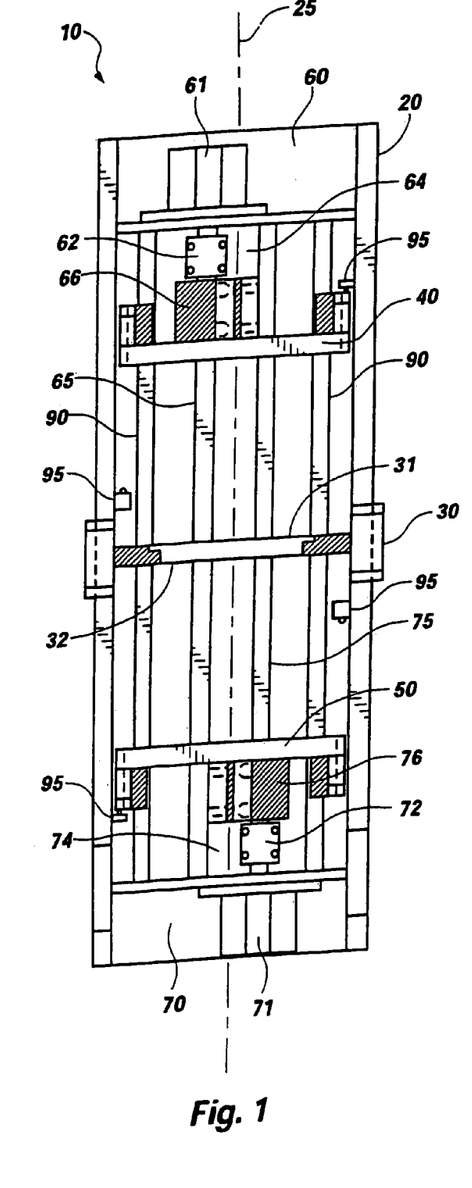
FIG. 1 is a top view of a test apparatus according to the present invention.
Figure 2:
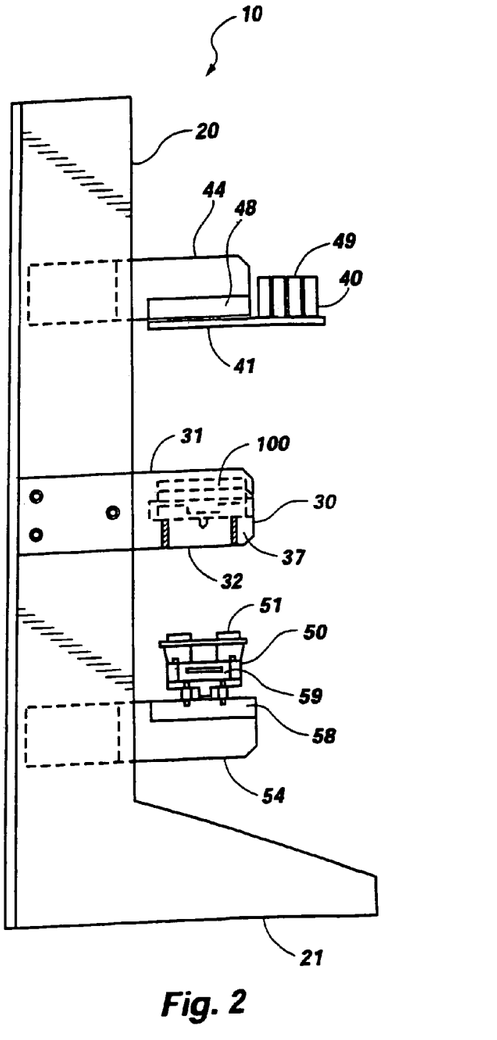
FIG. 2 is a side view of the test apparatus.

As illustrated in drawing FIGS. 1 and 2, shown is an exemplary embodiment of a test device according to this invention. Illustrated in drawing FIG. 1 is a top view of a test device 10 while drawing FIG. 2 shows a side view of the test device 10. The test device 10 includes a frame 20 having a longitudinal axis 25. Securely attached to the frame 20 is a component fixture 30, which has a first side 31 and a second side 32. The component fixture 30 is adapted to receive an ECUT 100 that is to be tested (see hidden lines in drawing FIG. 2). Alternatively, the component fixture 30 may be adapted to receive multiple electronic components 100. The component fixture 30 may have any suitable structure capable of receiving at least one electronic component 100.

Referring to drawing FIG. 1, one embodiment of the test device 10 also includes a first linear positioner 60 and a second linear positioner 70. Each linear positioner 60, 70 is comprised of rotary actuators 61, 71 and a transmission mechanism 64, 74. The transmission mechanisms 64, 74 convert rotary motion of the rotary actuators 61, 71 to longitudinal motion along an axis parallel to the longitudinal axis 25 of the frame 20. Securely affixed to the transmission mechanism 64 of the first linear positioner 60 is a first contact plate 40. The first contact plate 40 is disposed adjacent the first side 31 of the component fixture 30. Disposed adjacent the second side 32 of the component fixture 30 is a second contact plate 50. The second contact plate 50 is securely affixed to the transmission mechanism 74 of the second linear positioner 70. Any suitable structure, such as mounting brackets 44, 54, may be used to attach the first and second contact plates 40, 50 to their respective transmission mechanisms 64, 74.

Figure 3:
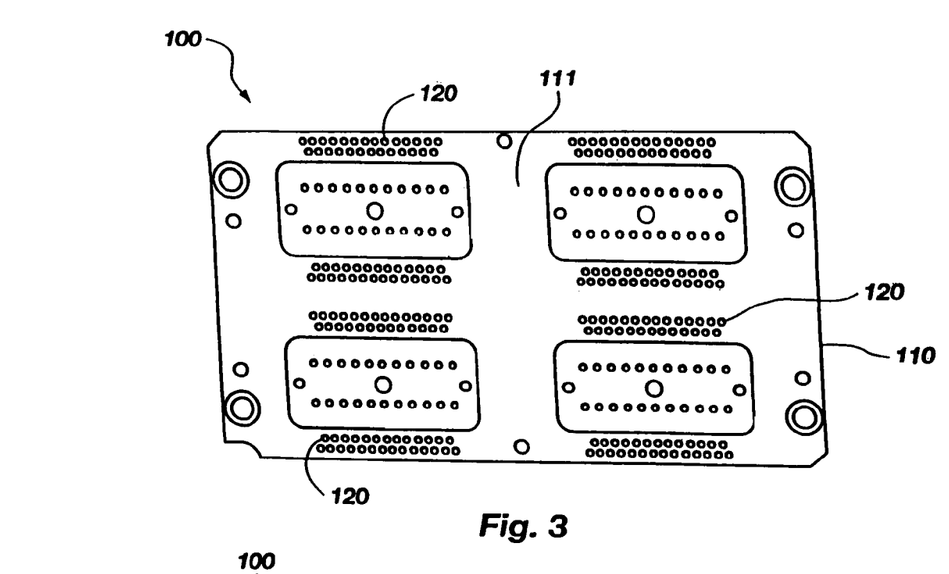
FIG. 3 is a top view of an exemplary ECUT.
Figure 4:
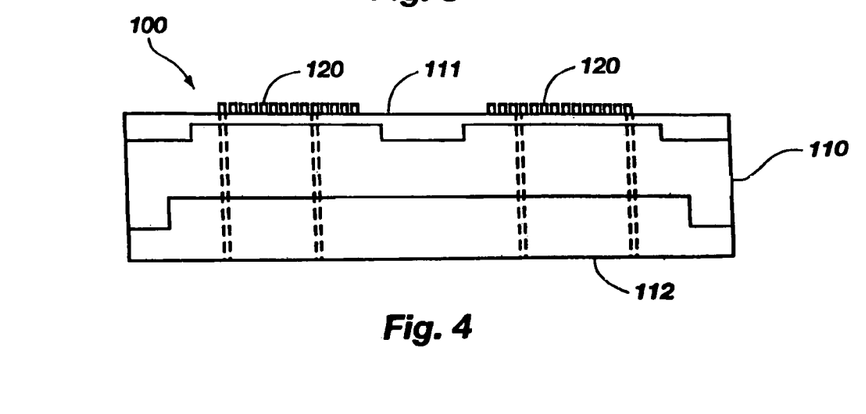
FIG. 4 is a front view of the exemplary ECUT.
Figure 5:
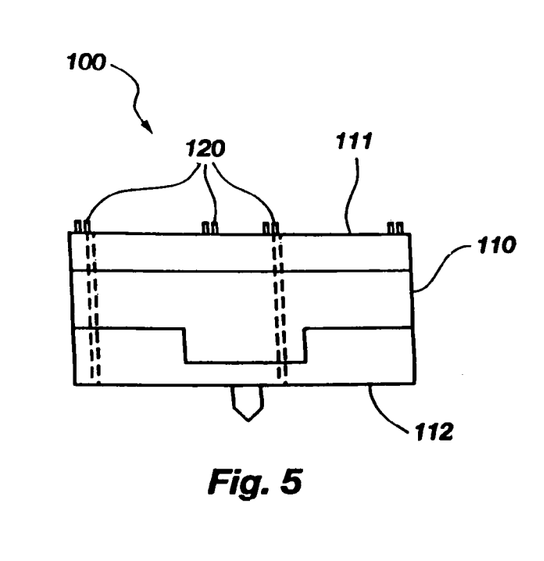
FIG. 5 is a side view of the exemplary ECUT.

Typically, as shown in drawing FIGS. 3 through 5, the ECUT 100 is comprised of a case or substrate 110 having first and second sides 111, 112, respectively. Extending from the first side 111 of the case 110 of the ECUT 100 is a plurality of contact pins 120. The contact pins 120 may be grouped together in one or more two-dimensional arrays to form a pin-out. The plurality of contact pins 120 may also extend through the case 110 to the second side 112 of the case 110 of the ECUT 100, thereby forming a second connecting point on each contact pin 120. In FIGS. 4 and 5, the contact pins 120 extending through the case 110 are shown in hidden line. Only a small number of contact pins 120 are shown extending through the case 110 for clarity; however, it should be understood that all of the contact pins 120 may extend through the case 110 of the ECUT 100.

Thus, electrical communication may be established with the plurality of contact pins 120 on either side 111, 112 of the case 110 of the ECUT 100.

Referring to FIG. 2, the first contact plate 40 has a plurality of test contacts 41 that is configured to electrically contact the plurality of contact pins 120 extending from the first side 111 of the case 110 of the ECUT 100. Each individual contact pin 120 of the ECUT 100 preferably has a corresponding test contact 41 on the first contact plate 40. Similarly, the second contact plate 50 has a plurality of test contacts 51 configured to electrically contact the plurality of contact pins 120 on the second side 112 of the case 110 of the ECUT 100. Again, each individual contact pin 120 of the ECUT 100 preferably has a corresponding test contact 51 on the second contact plate 50. It will be appreciated by those of ordinary skill in the art that the contact plates 40, 50 may have more test contacts 41, 51 than there are contact pins 120, thus enabling the contact plates 40, 50 to be used in conjunction with a variety of ECUT types having differing numbers of contact pins 120. The test contacts 41, 51 may be any suitable structure as known in the art for establishing temporary electrical contact with a contact pin 120. Also, the contact plates 40, 50 may include additional test circuitry 59 and sensors 49 (see drawing FIG. 2) as may be necessary, depending on the type of electrical characteristics being measured.

Figure 6:
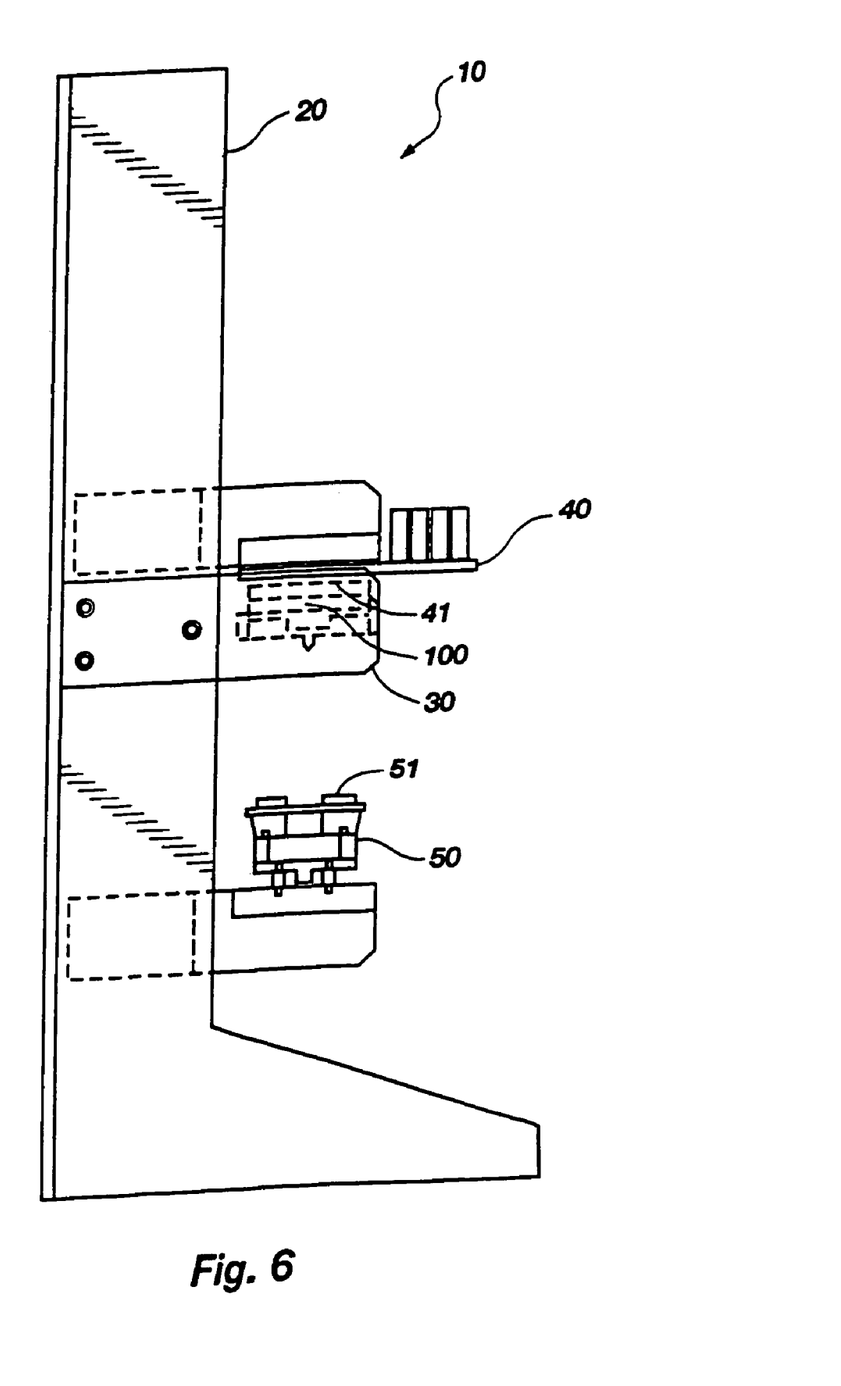
FIG. 6 is a side view of the test apparatus.
Figure 7:
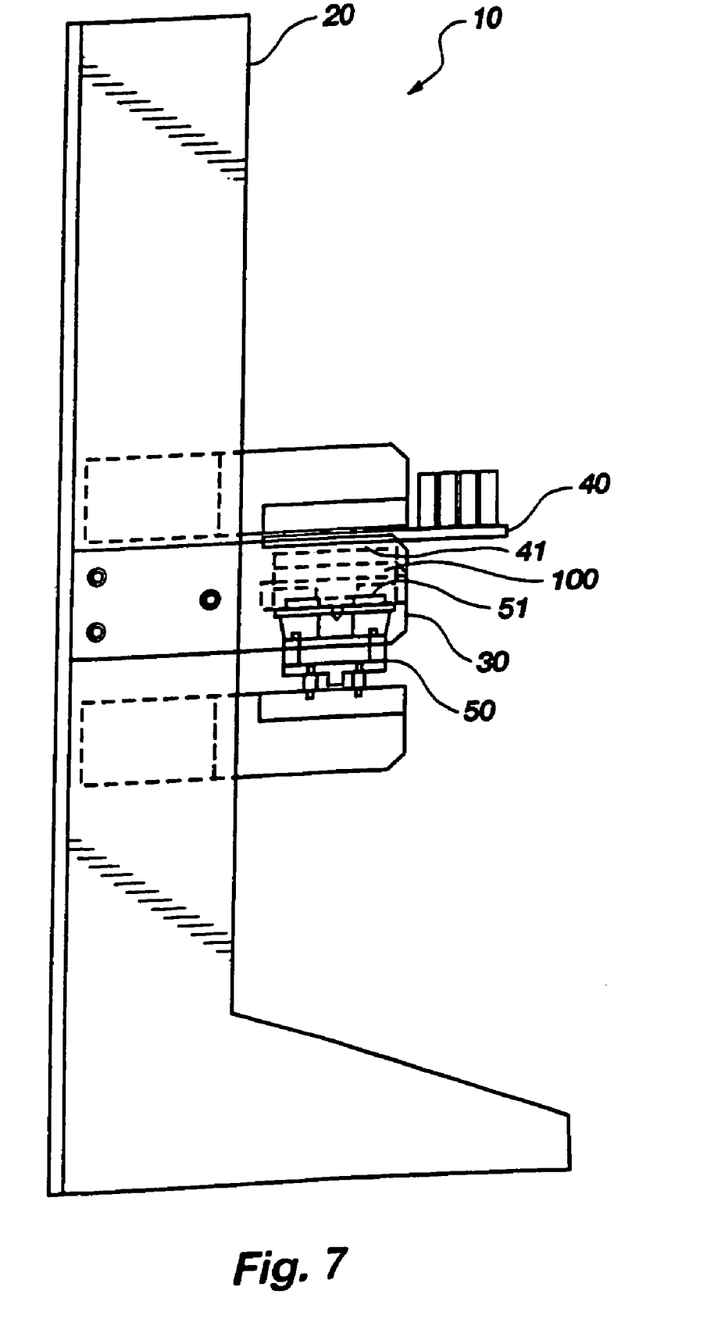
FIG. 7 is a side view of the test apparatus.

The first linear positioner 60 and accompanying transmission mechanism 64 are configured for moving the first contact plate 40 towards the component fixture 30, such that temporary electrical communication can be established between each contact pin 120 of the ECUT 100 and a corresponding test contact 41 of the first contact plate 40. Referring to drawing FIG. 6, shown is the first contact plate 40 in an abutting relationship with the ECUT 100, thereby forming electrical contact with the ECUT 100. Similarly, the second linear positioner 70 and transmission mechanism 74 are configured for moving the second contact plate 50 towards the component fixture 30 in order to establish temporary electrical communication between each contact pin 120 of the ECUT 100 and a corresponding test contact 51 of the second contact plate 50. Referring to drawing FIG. 7, shown is the second contact plate 50 as well as the first contact plate 40, abutting and forming electrical communication with the ECUT 100.

The test device 10 is preferably configured such that accurate alignment can be achieved between the test contacts 41 and contact pins 120 and between the contact pins 120 and test contacts 51. Accurate contact pin alignment may be achieved by manufacturing the frame 20, the first and second linear positioners 60, 70, the transmission mechanisms 64, 74, the component fixture 30, and the first and second contact plates 40, 50 according to tight design tolerances. Alternatively, accurate contact pin alignment may be achieved by associating a secondary adjustment system 48, 58 (see drawing FIG. 2) with each contact plate 40, 50. For example, the secondary adjustment systems may be manually operated, two-dimensional motion stages capable of accurate positioning in two perpendicular directions. Two-dimensional motion stages—also referred to as X-Y positioners or positioning slides—may be obtained from a number of manufacturers such as, for example, those available from PIC Design of Middlebury, Conn., or Designatronics, Techno Division of New Hyde Park, N.Y.

As shown in drawing FIGS. 1 and 2, the frame 20 may be a generally rectangularly shaped structure orientated vertically with its base surface 21 resting upon ground. If the frame 20 is in a vertical orientation, the ECUT 100 may be secured to the component fixture 30 by gravitational forces. Those of ordinary skill in the art will appreciate that the frame 20 may be of any suitable configuration and, further, that the test device 10 and frame 20 may be orientated horizontally. If the frame 20 is in a horizontal orientation, the ECUT 100 may be secured to the component fixture 30 using any suitable fastener 37 (see drawing FIG. 2) as known in the art, such as screws.

The transmission mechanisms 64, 74 may comprise any suitable devices as are known in the art for converting rotational motion to linear motion. As shown in drawing FIG. 1, and by way of example only, the transmission mechanism 64 may include a lead screw 65 coupled with a follower 66. The lead screw 65 is securely connected to the rotary actuator 61 by a coupling 62, which may be either rigid or flexible. The follower 66, which is securely connected to the first contact plate 40, is configured to move linearly along the axis of the lead screw 65 as the lead screw 65 is rotated by the rotary actuator 61. Therefore, rotation of the lead screw 65 causes the follower 66 and attached first contact plate 40 to move parallel to the longitudinal axis 25 of the frame 20. To provide additional support for the first contact plate 40 while translating along the longitudinal axis 25, linear bearings 90 may be disposed within the frame 20 parallel to the longitudinal axis 25. The first contact plate 40 is slidably supported by the linear bearings 90. Similarly, transmission mechanism 74 also includes a lead screw 75, securely connected to the rotary actuator 71 via coupling 72, and a follower 76 coupled with the lead screw 75. The second contact plate 50 is securely attached to the follower 76 and rotation of the lead screw 75 provides linear motion of the second contact plate 50 along the longitudinal axis 25. The second contact plate 50 is also slidably supported by the linear bearings 90. Referring to drawing FIGS. 6 and 7, shown is the first and second contact plates 40, 50 after being moved toward the component fixture 30 and ECUT 100 by the first and second linear positioners 60, 70, respectively.

It will be appreciated by those of ordinary skill in the art that the rotary actuators 61, 71 may alternatively be linear actuators such as, for example, linear solenoids. If linear actuators are used, rotary-to-linear motion conversion would not be necessary, although support features such as the linear bearings 90 may still be desirable. Those of ordinary skill in the art will also appreciate that the first and second linear positioners 60, 70 may be manually operable. For example, the lead screws 65, 75 may be rotatable by a hand-operated crank (not shown in drawing figures). Additionally, if rotary actuators 61, 71 are used to drive the first and second second linear positioners 60, 70, positioning sensors 95 (see drawing FIG. 1) may be disposed within the frame 20 and configured to sense the location of the first and second contact plates 40, 50, particularly as the contact plates 40, 50 come in close proximity to the contact pins 120 of the ECUT 100.

The various parts of the test device 10 herein described may be manufactured from any suitable materials as known in the art. The frame 20, component fixture 30, and mounting brackets 44, 54 may be fabricated from a metal such as, for example, 6061-T6 aluminum, or stainless steel. The lead screws 65, 75, followers 66, 76, and linear bearings 90 may be manufactured from a suitable carbon or alloy steel. The couplings 62, 72 may be fabricated from any suitable metal or plastic material as known in the art. The design and construction of the contact plates 40, 50 will vary depending on the type of ECUT 100 being tested and the electrical characteristics being measured. Materials that may be suitable for the contact plates 40, 50 include printed circuit board, plastic, and semiconductor materials. The test contacts 41, 51 are preferably constructed from a suitable conductive metal as known in the art.

Figure 8:
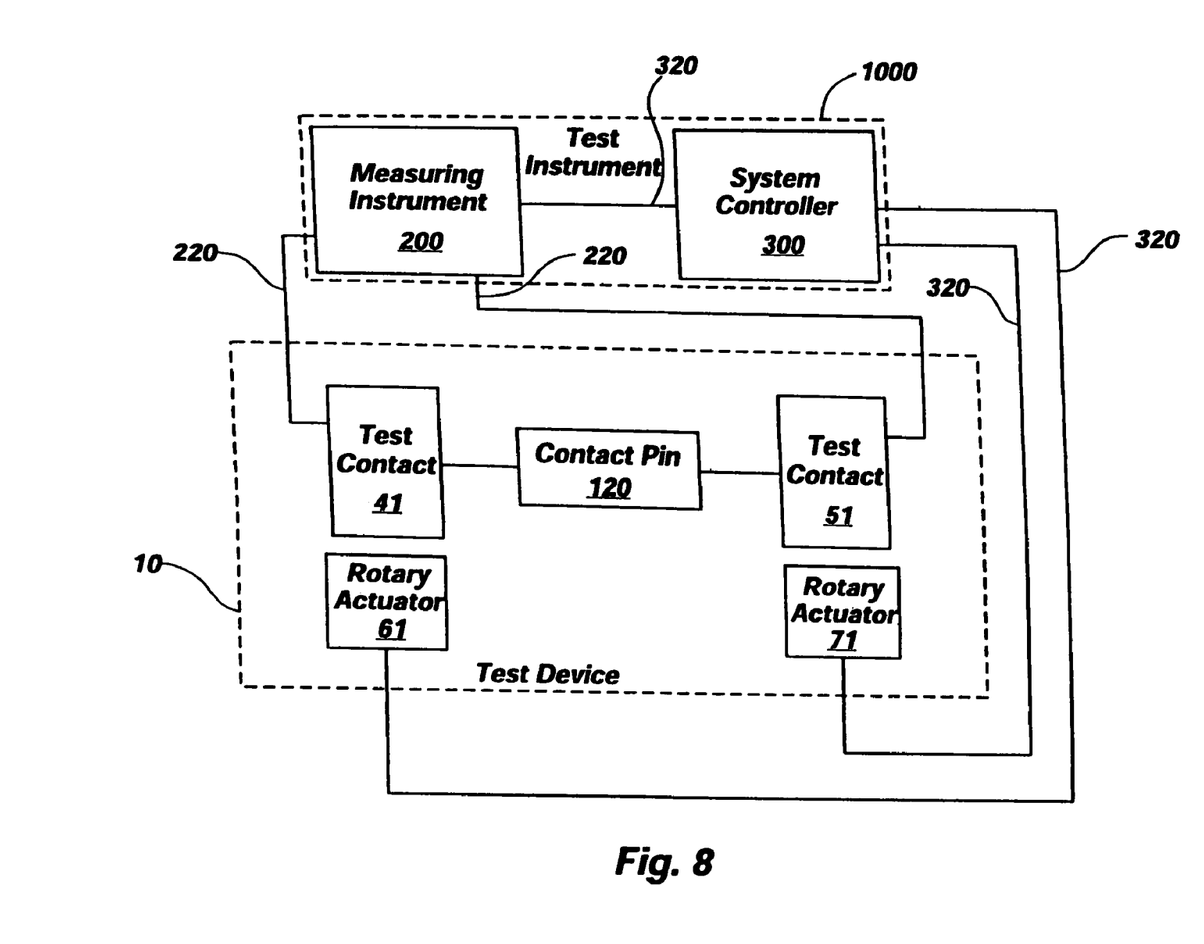
FIG. 8 is a schematic diagram of an apparatus according to this invention.

In order to measure the electrical characteristics of the contact pins 120 on the ECUT 100, the test device 10 may be associated with a measuring instrument 200 as shown in the schematic diagram of FIG. 8. The measuring instrument 200 is electrically connected to the test contacts 41 of the first contact plate 40, and to the test contacts 51 of the second contact plate 50. Any suitable connector cable 220 as known in the art may be used to provide electrical communication between the test contacts 41, 51 and the measuring instrument 200. The measuring instrument 200 may be any commercially available electrical measuring device as known in the art, the selection of a suitable measuring instrument 200 being limited only by the type of ECUT 100 being tested and the electrical characteristics being measured. The measuring instrument 200 may be configured to record and store test results for later review by a test operator.

In one embodiment, the test device 10 and measuring instrument 200 are also associated with a system controller 300 as shown in drawing FIG. 8. The system controller 300 is in electrical communication with the measuring instrument 200 and is configured to direct the measuring instrument 200 to measure and record electrical characteristics of the contact pins 120. Additionally, the system controller 300 may be in electrical communication with the rotary actuators 61, 71, allowing the system controller 300 to regulate the position of the first and second contact plates 40, 50 with respect to the ECUT 100. Any suitable connector cables 320 as known in the art may be used to electrically connect the system controller 300 to the measuring instrument 200, and to the rotary actuators 61, 71 of the first and second linear positioners 60, 70. Thus, the system controller 300 enables the test operator to subject an ECUT 100 to at least a partially automated test sequence. In this configuration, the test operator simply loads an ECUT 100 into the component fixture 30 and directs the system controller 300 to commence testing.

As part of an automated test sequence, the system controller 300 may direct the test device 10 and measuring instrument 200 to measure as many electrical characteristics as desired for each contact pin 120 of the ECUT 100. Further, the electrical characteristics of any designated number of contact pins 120 may be measured. The system controller 300 may also be configured to record and store the test results for later review by the test operator. The system controller 300 may be a personal computer programmed by the test operator to perform a desired test sequence or, alternatively, the system controller 300 and measuring instrument 200 may be integrated as a single, stand-alone test instrument 1000 as shown in drawing FIG. 8.

A method of characterizing the contact pins 120 of an ECUT 100 using the test device 10 and an automated test sequence will now be described. With reference to the flow chart shown in drawing FIG. 9, the test operator first loads an ECUT 100 into the component fixture 30 of the test device 10. The test operator then directs the system controller 300 to commence testing of the ECUT 100. Next, the system controller 300 directs the first linear positioner 60 to move the first contact plate 40 towards the ECUT 100 until electrical communication is established between each contact pin 120 of the ECUT 100 and a corresponding test contact 41 of the first contact plate 40.

Figure 9:
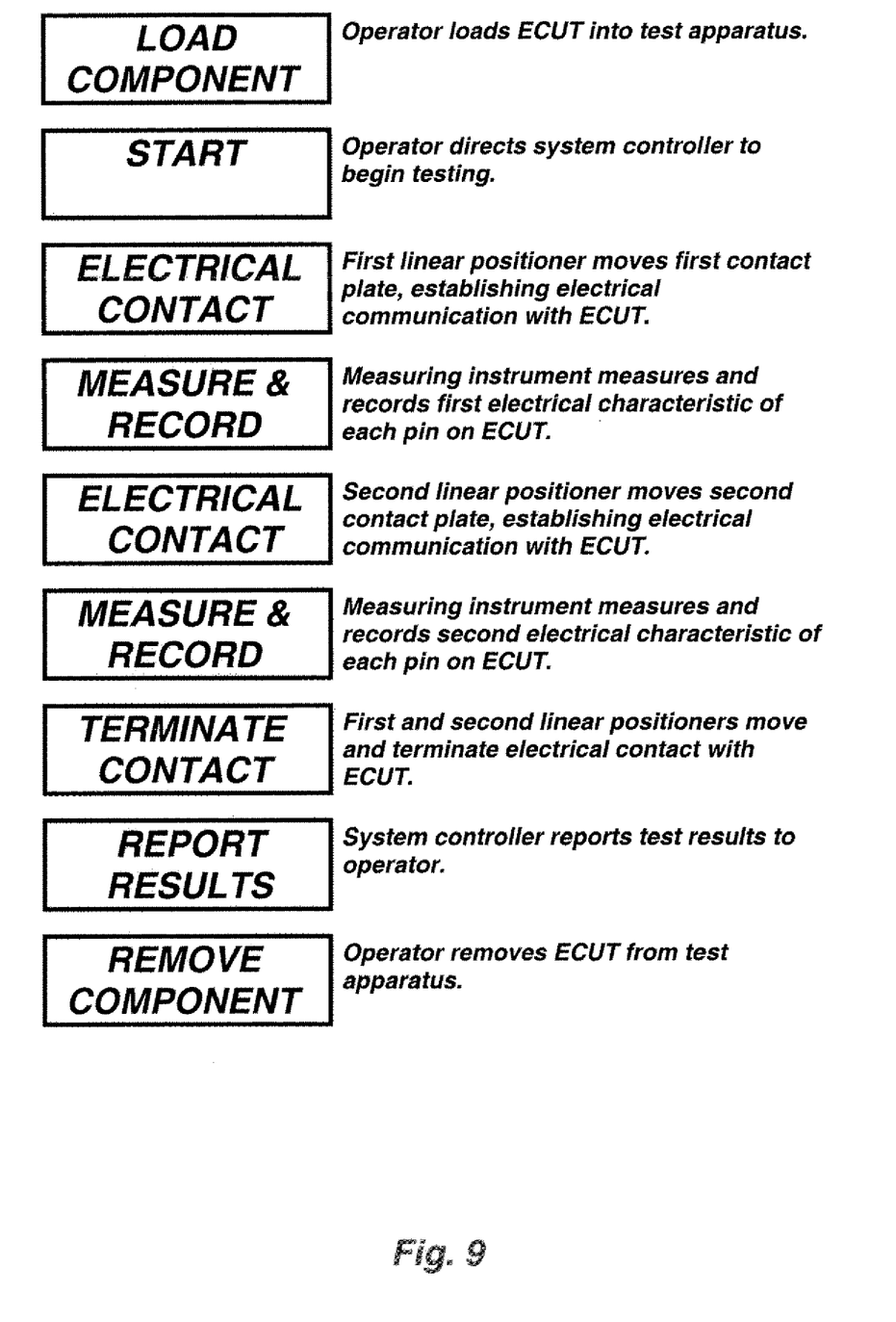
FIG. 9 is a flow chart of a test method according to this invention.

Once electrical communication is established between the contact pins 120 and test contacts 41, the system controller 300 directs the measuring instrument 200 to measure and record a first electrical characteristic of each contact pin 120 of the ECUT 100. If the contact pins 120 extend through to the second side 112 of the case 110 of the ECUT 100, the system controller 300 then directs the second linear positioner 70 to move the second contact plate 50 towards the ECUT 100 until electrical communication is established between each contact pin 120 on the second side 112 of the case 110 of the ECUT 100 and a corresponding test contact 51 of the second contact plate 50. The system controller 300 then directs the measuring instrument 200 to measure and record a second electrical characteristic of each contact pin 120 of the ECUT 100.

Once the second electrical characteristic of each contact pin 120 has been measured and recorded, the system controller 300 directs the first and second linear positioners 60, 70 to retract the first and second contact plates 40, 50, respectively, thereby severing electrical contact with the ECUT 100. The system controller 300 then reports the test results to the test operator. To conclude the test sequence, the test operator removes the ECUT 100 from the test device 10. The foregoing partially automated test sequence can then be repeated with another ECUT 100.

Figure 10:
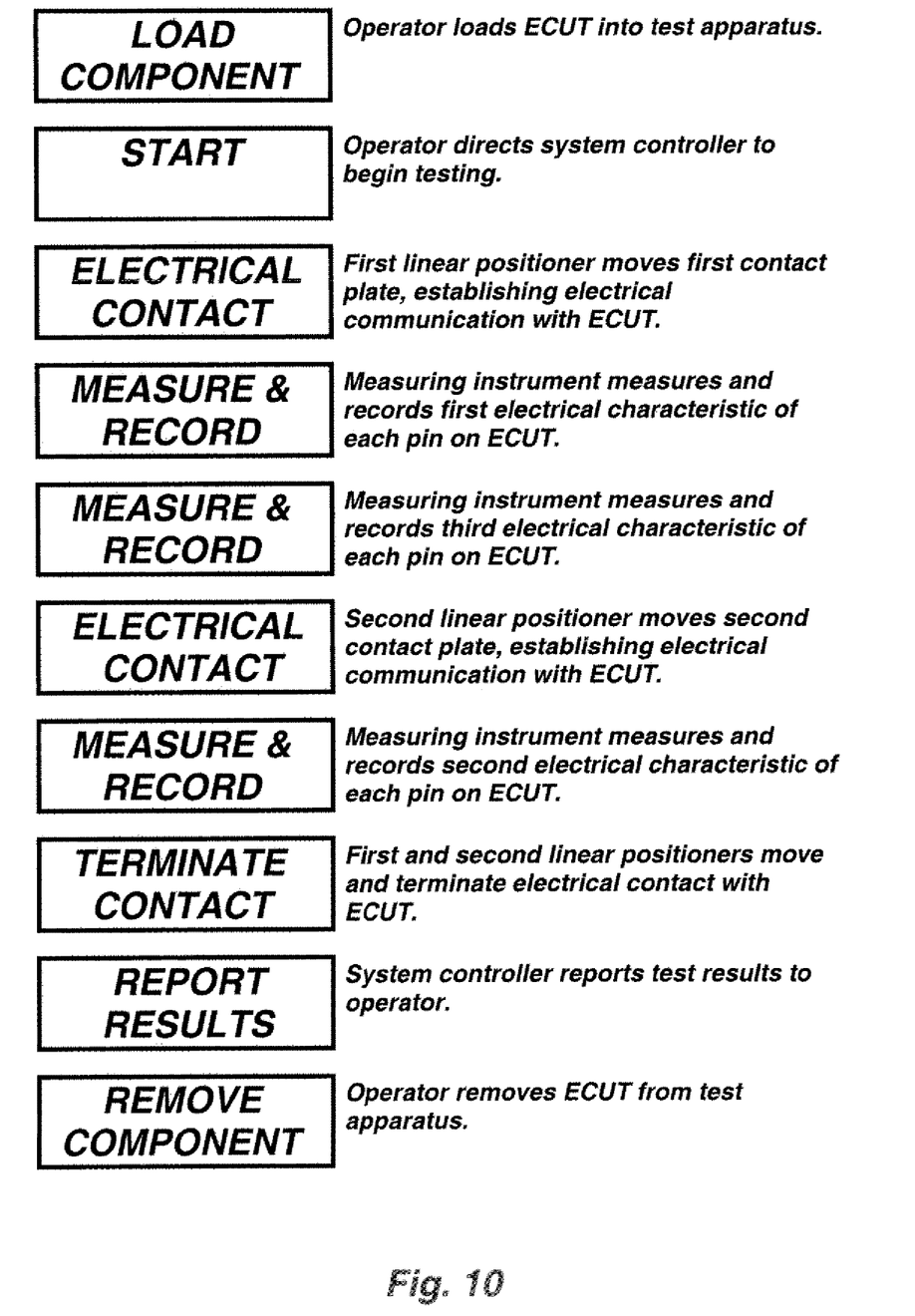
FIG. 10 is a flow chart of a test method according to this invention.

Alternatively, as shown in the flow chart of drawing FIG. 10, the automated test sequence may be adapted to measure an additional electrical characteristic. Referring to drawing FIG. 10, after the system controller 300 has directed the measuring instrument 200 to measure and record the first electrical characteristic, and prior to directing the second contact plate 50 to make electrical contact with the ECUT 100, the system controller 300 directs the measuring instrument 200 to measure and record a third electrical characteristic of each contact pin 120 on the ECUT 100. Once the third electrical characteristic has been recorded for each contact pin 120, the test sequence continues as previously described with respect to the flow chart of drawing FIG. 9.

It will be appreciated by those of ordinary skill in the art that the above-described method may be used to measure a wide variety of electrical characteristics. By way of example only, the first electrical characteristic may be pin-to-case shorting, the second electrical characteristic may be pin resistance, and the third electrical characteristic may be pin-to-pin shorting. Pin-to-pin leakage may also be measured. Those of ordinary skill in the art will also appreciate that the automated test sequences shown in the flow charts of drawing FIGS. 9 and 10 may be significantly varied to suit the individual test operator's needs. Also, the component fixture 30 and first and second contact plates 40, 50 may be configured to test more than one ECUT 100 simultaneously.

In summary, the apparatus and method set forth above provide for the automated measurement of a plurality of electrical characteristics of each contact pin of an electronic component having a large number of contact pins extending therefrom. The test method may be performed accurately and repeatedly, and the method is easily adaptable to automation and control by a system controller such as a personal computer. Automation of the test method allows for the rapid and consistent characterization of the pin-out on a plurality of electronic components with minimal intervention by a test operator and, additionally, allows for the test operator to easily vary electrical parameters measured within a test sequence by reprogramming the system controller.

By way of example only, and without introducing any unnecessary limitations therefrom, a specific application of this invention will be provided for further illustration. The ECUT 100 is a testsite module, which is similar to the electronic component shown in drawing FIGS. 3 through 5.

The testsite module is a device used for interfacing an IC type package to a test instrument. The testsite module is a mechanical device having many contact pins extending from two opposing sides of a module case for electrical connection between the IC package and test instrument.

The test device is similar to that depicted in drawing FIGS. 1, 2, 6, and 7. The frame is a vertically orientated, rectangularly shaped structure. The component fixture is a mounting bracket rigidly attached to the frame with fasteners. The testsite module is held within the component fixture by the force of gravity. The first and second linear positioners are each comprised of a Model M2INSXA-LNN-N3-02 rotary stepper motor supplied by Scientific Pacific of Rockford, Ill., and a Model 2115 lead screw and follower assembly manufactured by Rohlix and available from Zero-Max of Minneapolis, Minn. Linear bearings are also mounted in the frame.

The first contact plate is a circuit board with an array of contacts configured to interface with the contact pins of the testsite module. A mounting bracket attaches the first contact plate to the follower of the first linear positioner. The second contact plate is comprised of an IC package and an adapter. The IC package is of the type that the testsite module is adapted for use with; however, all of the pins within the IC package are internally shorted together, creating a shorted bus. This shorted bus is then held within the adapter, which is supplied by Aetrium Incorporated of San Diego, Calif. A mounting bracket rigidly connects the adapter to the follower of the second linear positioner. Both the first and second contact plates are connected to the measuring instrument with conventional 60-conductor ribbon cables.

Alignment between the contact pins on the testsite module and the test contacts on the first and second contact plates is achieved by tight design tolerances. Home position sensors are used to "home" the position of the first and second contact plates at the beginning of a test sequence. Contact is made with the testsite module by directing the stepper motors of the first and second linear positioners to move a specified number of steps. Stepper motors are accurate and repeatable in this type of positioning system.

The measuring instrument is a Cirrus 1000R tester, which is an off-the-shelf tester built by the Cirrus Systems Corporation of Salt Lake City, Utah. With the first contact plate in electrical contact with the testsite module, the Cirrus 1000R tester can test for the shorted condition of an individual pin, and it can measure pin resistance when both the first and second contact plates have engaged the testsite module. The system controller is a personal computer capable of interfacing with the Cirrus 1000R tester and also includes a PC34 motor controller card manufactured by Oregon Micro Systems of Beaverton, Oreg.

Using the above-described apparatus, the method of characterizing the contact pins of a testsite module comprises the following test sequence. First, a test operator loads the testsite module into the component fixture. Second, the test operator directs the system controller to commence testing. Third, the system controller instructs the stepper motor of the first linear positioner to move the first contact plate into contact with the testsite module. Fourth, the system controller directs the Cirrus 1000R tester to check each contact pin of the testsite module for a shorted condition with the testsite module case. Fifth, the system controller directs the Cirrus 1000R tester to check each contact pin of the testsite module for a shorted condition with all other pins on the testsite module. Sixth, the system controller instructs the stepper motor of the second linear positioner to move the second contact plate into contact with the testsite module. Seventh, the system controller directs the Cirrus 1000R tester to measure the individual pin resistance of each contact pin of the testsite module. Eighth, the system controller directs the first and second linear positioners to terminate contact between the first contact plate and the testsite module and between the second contact plate and the testsite module. Ninth, the system controller reports the test results obtained by the Cirrus 1000R tester to the test operator. Tenth, the test operator removes the testsite module from the test apparatus. This test sequence can then be repeated for another testsite module.

The foregoing detailed description and accompanying drawings are only illustrative and not restrictive. They have been provided primarily for clearness of understanding and no unnecessary limitations are to be understood therefrom. Numerous modifications and alternative arrangements may be devised by those skilled in the art without departing from the spirit of the present invention and the scope of the appended claims.

What is claimed is:

1. A device for testing an electronic component, comprising:
   a component fixture configured to receive at least one electronic component to be tested having a plurality of protruding electrical connecting structures on a first surface thereof and an associated plurality of electrical connecting structures on an opposing, second surface thereof in a manner wherein the plurality of protruding electrical connecting structures on the first surface and the associated plurality of electrical connecting structures on the second surface of the at least one electrical component are exposed;
   a first contact plate having a plurality of first test contacts disposed adjacent a first side of the component fixture, wherein the first contact plate is configured for linear movement toward the first surface of the at least one electrical component to establish temporary contact between the plurality of first test contacts on the first contact plate and the plurality of protruding electrical connecting structures on the first surface of the at least one electrical component; and
   a second contact plate having a plurality of second test contacts corresponding to the plurality of first test contacts and disposed adjacent a second side of the component fixture, wherein the second contact plate is configured for linear movement toward the second surface of the at least one electrical component to establish temporary contact between the plurality of second test contacts on the second contact plate and the associated plurality of electrical connecting structures on the second surface of the at least one electrical component.

2. The device of claim 1, further comprising a measuring instrument in electrical communication with the plurality of first test contacts and the plurality of second test contacts, the measuring instrument configured for measuring at least one electrical characteristic of at least one electrical connecting structure of the plurality of protruding electrical connecting structures on the first surface and an associated electrical connecting structure of the associated plurality of electrical connecting structures on the second surface of the at least one electronic component.

3. The device of claim 2, wherein the at least one electrical characteristic comprises at least one of individual pin resistance, pin-to-pin shorting, pin-to-case shorting, and pin-to-pin leakage.

4. The device of claim 2, further comprising a system controller in electrical communication with the measuring instrument configured for automatically performing a test sequence and recording the results thereof.

5. The device of claim 4, wherein the test sequence includes measuring at least one of pin resistance, pin-to-pin shorting, pin-to-case shorting, and pin-to-pin leakage of each protruding electrical connecting structure of the plurality of protruding electrical connecting structures on the first surface and the associated electrical connecting structure of the associated plurality of electrical connecting structures on the second surface of the at least one electronic component.

6. The device of claim 4, wherein the system controller and the measuring instrument are integrated, forming a test instrument.

7. The device of claim 4, wherein the system controller comprises a personal computer.

8. The device of claim 1, further comprising:
a first linear positioner operably coupled to both the first contact plate and the component fixture and configured for providing controlled linear movement of the first contact plate with respect to the component fixture; and
a second linear positioner operably coupled to both the second contact plate and the component fixture and configured for providing controlled linear movement of the second contact plate with respect to the component fixture.

9. The device of claim 8, wherein at least one of the first linear positioner and the second linear positioner comprises a rotary motor having an output shaft and a transmission mechanism configured to convert rotational motion of the output shaft to linear motion along an axis of motion, the transmission mechanism being connected to one of the first contact plate and the second contact plate, respectively.

10. The device of claim 9, wherein the rotary motor comprises a stepper motor.

11. The device of claim 9, wherein the transmission mechanism comprises:
a lead screw attached to the output shaft of the rotary motor; and
a follower rotatably connected to the lead screw and connected to one of the first contact plate and the second contact plate.

12. The device of claim 9, further comprising a system controller is in electrical communication with the rotary motor of the at least one of the first linear positioner and the second linear positioner.

13. The device of claim 12, further including at least one position sensor located to detect a position of at least one of the first contact plate and the second contact plate.

14. The device of claim 8, wherein at least one of the first linear positioner and the second linear positioner comprises:
a linear actuator having an output shaft configured to provide linear motion between the component fixture and one of the first contact plate and the second contact plate.

15. The device of claim 1, further comprising:
at least one position adjustment mechanism associated with the component fixture, wherein the at least one position adjustment mechanism is configured to position the component fixture relative to at least one of the first contact plate and the second contact plate.

16. The device of claim 1, wherein the component fixture is configured to retain the at least one electronic component therein by a force of gravity.

17. The device of claim 1, further comprising at least one fastener configured to attach the at least one electronic component to the component fixture.

18. The device of claim 1, further comprising electrical circuitry disposed on at least one of the first contact plate and the second contact plate.

* * * * *